(12) United States Patent
Noh et al.

(10) Patent No.: US 8,988,264 B2
(45) Date of Patent: Mar. 24, 2015

(54) ANALOGUE TO DIGITAL CONVERTER

(71) Applicant: NXP B.V., Eindhoven (NL)

(72) Inventors: Kyoohyun Noh, College Station, TX (US); Jose de Jesus Pineda De Gyvez, Eindhoven (NL); Maarten Vertregt, Eindhoven (NL)

(73) Assignee: NXP, B.V., Eindhoven (NL)

( * ) Notice: Subject to any disclaimer, the term of this patent is extended or adjusted under 35 U.S.C. 154(b) by 72 days.

(21) Appl. No.: 13/780,679

(22) Filed: Feb. 28, 2013

(65) Prior Publication Data

US 2014/0240157 A1    Aug. 28, 2014

(51) Int. Cl.
*H03M 1/12* (2006.01)
*H03M 1/00* (2006.01)
*H03M 1/60* (2006.01)
*H03M 1/06* (2006.01)

(52) U.S. Cl.
CPC ........... *H03M 1/002* (2013.01); *H03M 1/60* (2013.01); *H03M 1/0682* (2013.01); *H03M 1/1215* (2013.01)
USPC .......................................... 341/155; 341/143

(58) Field of Classification Search
CPC ..... H03M 1/60; H03M 1/121; H03M 1/1215; H03M 1/0682
USPC .......................................... 341/120, 143, 155
See application file for complete search history.

(56) References Cited

U.S. PATENT DOCUMENTS

| | | | |
|---|---|---|---|
| 7,609,187 B2* | 10/2009 | Maezawa et al. | 341/143 |
| 8,471,743 B2* | 6/2013 | Huang | 341/143 |
| 8,542,138 B2* | 9/2013 | Galton et al. | 341/118 |

OTHER PUBLICATIONS

Dunlop, A.E. et al. "150/30 Mb/s CMOS Non-Oversampled Clock and Data Recovery Circuits with Instantaneous Locking and Jitter Rejection", IEEE Int'l. Solid-State Circuits Conf., Digest of Technical Papers, pp. 44-45, 338 (1995).
Watanabe, T. et al. "An All-Digital Analog-to-Digital Converter with 12-μV/LSB Using Moving-Average Filtering", IEEE J. of Solid-State Circuits, vol. 38, No. 1, pp. 120-125 (2003).
Ahmed, I. et al. "A 50-MS/s (35 mW) to 1-kS/s (15 μW) Power Scaleable 10-bit Pipelined ADC Using Rapid Power-On Opamps and Minimal Bias Current Variation", IEEE J. Solid-State Circuits, vol. 40, No. 12, pp. 2446-2455 (Dec. 2005).
Baschirotto, A. et al. "Baseband Analog Front-End and Digital Back-End for Reconfigurable Multi-Standard Terminals", IEEE Circuits and Systems Magazine, vol. 6, No. 1, pp. 8-28 (2006).
Straayer, M.Z. et al. "A Multi-Path Gated Ring Oscillator TDC with First-Order Noise Shaping", IEEE J. of Solid-State Circuits, vol. 44, No. 4, pp. 1089-1098 (Apr. 2009).
Zhang, H. et al. "New Applications and Technology Scaling Driving Next Generation A/D Converters", European Conf. on Circuit Theory and Design, pp. 109-112 (Aug. 2009).
Watanabe, T. et al. "A 0.0027-mm² 9.5-bit 50-MS/s All-Digital A/D Converter TAD in 65-nm Digital CMOS", 16th IEEE Int'l. Conf. on Electronics, Circuits, and Systems, pp. 271-274 (Dec. 2009).
Kim, J. et al. "Analysis and Design of Voltage-Controlled Oscillator Based Analog-to-Digital Converter", IEEE Trans. on Circuits and Systems—I: Regular Papers, vol. 57, No. 1, pp. 18-30 (Jan. 2010).

(Continued)

*Primary Examiner* — Khai M Nguyen

(57) ABSTRACT

An Analogue to Digital Converter (ADC) having a Gated Ring Voltage Controlled Oscillator, GRVCO, to generate a phase signal according to an input voltage; and a quantization circuit to generate a quantized phase output signal according. The GRVCO operates in either a first or second mode of operation according to a gating control signal. In the first mode of operation, the GRVCO operates in a VCO mode with gating disabled. In the second mode of operation, the GRVCO operates in a GRVCO mode wherein gating is enabled or disabled according to a gating signal.

15 Claims, 7 Drawing Sheets

(56) References Cited

OTHER PUBLICATIONS

Daniels, J. et al. "A 0.02mm² 65nm CMOS 30MHz BW All-Digital Differential VCO-Based ADC with 64dB SNDR", 2010 IEEE Symp. on VLSI Circuits, pp. 155-156 (Jun. 2010).

Daniels, J. et al. "A/D Conversion Using Asynchronous Delta-Sigma Modulation and Time-to-Digital Conversion", IEEE Trans. on Circuits and Systems—I: Regular Papers, vol. 57, No. 9, pp. 2404-2412 (Sep. 2010).

Kim, J. et al. "A Digital-Intensive Receiver Front-End Using VCO-Based ADC with an Embedded 2nd-Order Anti-Aliasing Sinc Filter in 90nm CMOS", IEEE Int'l. Solid-State Circuits Conf., Digest of Technical Papers, pp. 176-178 (Feb. 2011).

Yu, W. et al. "A Time-Domain High-Order MASH $\Delta\Sigma$ ADC Using Voltage-Controlled Gated-Ring Oscillator", IEEE Trans. on Circuits and Systems—I: Regular Papers, 11 pgs (accepted Jun. 25, 2012).

Kapoor, A. et al. "Architectural Analysis for Wirelessly Powered Computing Platforms", IEEE Trans. on Very Large Scale Integration (VLSI) Systems, 12 pgs. (accepted Oct. 2012).

Ogasahara, Y. et al. "All-Digital Ring-Oscillator-Based Macro for Sensing Dynamic Supply Noise Waveform", IEEE J. Solid-State Circuits, vol. 44, No. 6, pp. 1745-1755 (Jun. 2009).

Vengattaramane, K. et al. "A Gated Ring Oscillator Based Parallel-TDC System with Digital Resolution Enhancement", IEEE Asian Solid-State Circuits Conf., pp. 57-60 (Nov. 2009).

Kapoor, A. et al. "Architectural Analysis for Wirelessly Powered Computing Platforms," accepted for publn. in IEEE Trans. on VLSI (Oct. 2012).

* cited by examiner

ANALOGUE TO DIGITAL CONVERTER

FIELD OF THE INVENTION

This invention relates to analogue to digital converters.

BACKGROUND OF THE INVENTION

The down-scaling of CMOS devices and the emergence of new applications have become driving forces in the evolution of Analogue-to-Digital Converter (ADC) architecture. Technology down-scaling towards nanometer devices is challenging conventional IC design methodology. In particular, the low intrinsic gain and reduced dynamic range of devices, due to low supply voltages, make it difficult to design an ADC based on voltage domain signal processing.

However, the enhanced speed, increased time resolution, and reduced size of modern nanometer devices enables highly integrated high-speed digital design, leading to the reduction of design effort. Therefore, digital dominant ADC architectures based on time domain signal processing have become a promising ADC architecture.

Emerging applications also start to require energy efficient operation of ADCs over a wide range of speeds. For example, a multi-standard receiver, a multi-sensor system, and a multi-format video processor system necessitate operation speeds ranging from KiloSample per second (KS/s) to MegaSamples per second (MS/s).

A power scalable pipelined ADC has been proposed in Imran Ahmed and David A. Johns, "A 50 MS/s (35 mW) to 1 KS/s (15 uW) power scalable 10 bit pipelined ADC using rapid power-on opamps and minimal bias current variation," in IEEE J. Solid-State Circuits, vol. 40, no. 12, December 2005, pp. 2446-2455. This circuit operates at speeds ranging from 1 KS/s to 50 MS/s. However, this architecture is based on an analog intensive approach, namely an op-amp design.

A conventional Voltage Controlled Oscillator (VCO)-based ADC is instead a digital dominant architecture, showing potential for operation over a wide range of speeds.

An open loop VCO-based ADC was proposed in Takamoto Watanabe, Tamotsu Mizuno, and Yasuaki Makino, "An all-digital Analog-to-digital Converter with 12 uV/LSB using moving average filtering," IEEE J. Solid-State Circuits, vol. 38, no. 1, pp. 120-125, January 2003. This ADC is based on an all-digital approach, consisting of a ring delay line, a counter, a latch, an encoder and a subtractor. Because this ADC was proposed for a sensor interface application, the design emphasis was placed on the high bit-resolution and compact size/area. The number of circulations in a ring delay line is counted for coarse quantization, and the fine phase quantization is performed by a latch and an encoder. Using this quantized information, an analog input voltage signal is converted into a digital code. However, since the same starting point in the ring delay line is used all the time, the properties of dynamic element matching (DEM) and first-order noise shaping cannot be achieved.

In order to compensate for the above disadvantages, a VCO can replace a ring delay line in the same architecture. As a result, DEM and first-order noise shaping properties can be achieved. Moreover, a variant of this architecture using differential input and passive interpolation has been developed so as to enhance the linearity and the bit resolution. This is disclosed in Jorg Daniels, Wim Dehaene, Andreas Wiesbauer, and Michiel Steyaert, "A 0.02 mm2 65 nm CMOS 30 MHz BW All-Digital differential VCO-based ADC with 64 dB SNDR," in IEEE Symp. VLSI circuits Techn. Dig. Of Papers, pp. 155-156, June 2010

Another important consideration for a VCO-based ADC is the trade-off between speed and bit resolution. If the sampling speed gets slower, the bit resolution is improved due to the accumulation of phase information. However, in the case of moderate/high resolution VCO-based ADCs, power consumption does not change severely with respect to the sampling frequency because a VCO keeps oscillating and it is the main contributor to the overall power consumption.

There is a conventional belief that a digital dominant ADC is always power scalable with respect to the sampling frequency, even though power scalability is only guaranteed when the power-consuming operation is synchronized to the sampling clock. In a conventional VCO-based ADC, the VCO's oscillation and a portion of quantization operation occur regardless of the sampling clock. This makes the power scalability poor in a conventional VCO-based ADC.

SUMMARY OF THE INVENTION

According to an aspect of the invention, there is provided an ADC.

There is proposed a Gated Ring VCO (GRVCO)-based ADC architecture which may provide the benefits associated with a VCO-based ADC, a Gated VCO (GVCO), and a Gated Ring Oscillator (GRO). A GRVCO-based ADC according to an embodiment may thus exploit the trade-off among power, bit resolution and speed.

Embodiments may offer the following advantages:

Digital dominant architecture which employs the concept of a GVCO and a GRO;

Power scalability with respect to the sampling frequency; and/or

First order noise shaping and DEM.

Embodiments may provide ADC architecture having power scalability over a wide range of operating speeds. Of note is that a GRVCO-based ADC according to an embodiment may have a digital dominant architecture and, by way of example only and not limitation, achieve improved power scalability when compared to conventional approaches.

A GRVCO-based ADC according to an embodiment may enable a trade-off among speed, power and resolution, whereas a conventional VCO-based ADC focuses on a trade-off between speed and resolution.

Also, a GRVCO-based ADC according to an embodiment may achieve improved power scalability over a wide range of operating speeds, whereas power scalability of a conventional VCO-based ADC is limited by the VCO's continuing oscillation and quantizer's redundant switching. Furthermore, embodiments may exhibit constant resolution performance through the removal of redundant oscillation and switching.

A GRVCO-based ADC according to an embodiment may be transformed into a conventional VCO-based ADC by disabling of a gating function.

A conventional GVCO may be used for power scalability and DEM. In this case, however, the first-order noise shaping property may not be utilized because the analogue state at each delay element's output is not preserved, leading to performance degradation. Conversely, since a GRVCO according to an embodiment may have the property of analogue state preservation, noise shaping may still be utilised.

The ring oscillator of the GRVCO may comprise a plurality of inverting elements, wherein each inverting element is connected to a positive power supply via first respective transistor and connected to a negative power supply via a second respective transistor. In a first mode of operation, the first and second switches connected to each inverting element may be arranged to be closed so as to enable oscillations in the ring oscillator, and, in a second mode of operation, the first and second switches connected to each inverting element may be arranged to be open so as to suspend oscillations in the ring oscillator.

Embodiments may further comprise an output circuit configured to receive the generated quantized phase output signal from the quantization circuit and to generate a frequency output signal based on one or more delayed versions of the generated quantized phased output signal.

The GRVCO may comprise a gating signal generator configured to generate the gating control signal according to a clock signal and a mode control signal.

Embodiments may be employed in a differential ADC or a time-interleaved ADC.

According to another aspect of the invention, there is provided an analogue to digital conversion method.

BRIEF DESCRIPTION OF DRAWINGS

Examples of the invention will now be described in detail with reference to the accompanying drawings, in which.

DETAILED DESCRIPTION OF EMBODIMENTS

Figure 1:
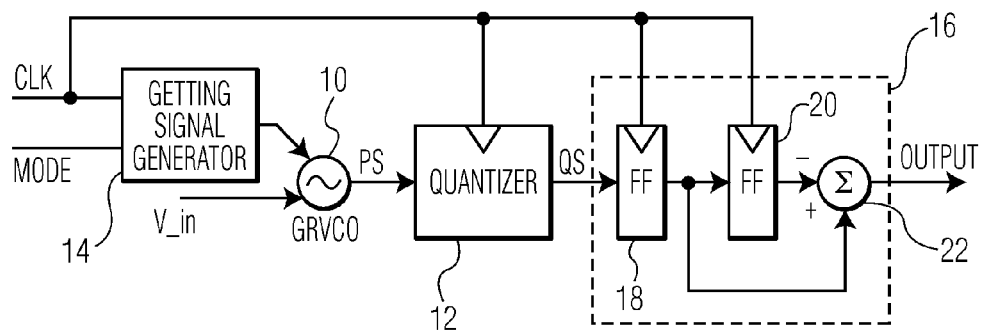
FIG. 1 is a schematic block diagram of a GRVCO ADC according to an embodiment.

A ring oscillator is a device comprising a chain of single-ended or differential inverting elements—whose output oscillates between two voltage levels. The output of the last inverting element is fed back into the first.

Unlike a traditional ring oscillator, a gated ring oscillator (GRO) structure only allows the oscillator to have transitions (i.e. to be "gated" on) when enabled and freezes the ring oscillator state when disabled. Thus, a GRO is configured to enable propagation of a transitioning signal during an enabled state and configured to inhibit propagation of the transitioning signal during a disabled state. In other words, stages are interconnected to allow sustained transitions to propagate during the enabled state and to preserve a state of the GRO during the disabled state.

In essence, a GRO adds a gating functionality to a classical inverting element-based ring oscillator by employing transistor switches in series with the positive and negative power supply connections for each inverting element. When the switches are closed (e.g. when a 'Gating Enable' signal indicates gating is disabled), oscillations are enabled and the ring of inverting elements behaves identically to a classical ring oscillator. Conversely, when the switches are open (e.g. when a 'Gating Enable' signal indicates gating to be enabled), oscillation is suspended and the oscillation state/phase at the end of the enabled state is held. It should also be noted that a GRO has no oscillation frequency control node.

A conventional GVCO has been used in the burst mode Clock and Data Recovery (CDR) application. A GVCO may be categorized into a LC-based GVCO or a delay element-based GVCO. In an ADC application, a delay element-based VCO is considered more proper than a LC-based GVCO because a delay element-based GVCO can provide fine quantization easily. Therefore, a delay element-based GVCO is only considered and simply referred to as a GVCO hereinafter.

Unlike the GRO, the GVCO has an oscillation frequency control node. In the GVCO, each delay element's output node is determined to be either VDD or GND when gated. Therefore, the GVCO's behaviour is different from the GRO's behaviour. Moreover, the GRVCO's frequency may be controlled by an input voltage unlike a GRO. Also, the output voltage state of each delay element is preserved, whereas it is reset to either VDD or GND in a conventional GVCO There is proposed a Gated-Ring VCO (GRVCO)-based ADC which can provide dual modes of operation. If the gating function is disabled, the GRVCO-based ADC transforms into a conventional VCO-based ADC.

Therefore, one can specify the operation mode to suit one or more applications. For convenience, we will refer to the two modes as: VCO mode; and GRVCO mode.

In other words, the proposed ADC provides an ADC employing the concept of a GRVCO. Its digital dominant approach may provide improved adaptability to next generation technology nodes. The ADC can support dual modes: a VCO mode and a GRVCO mode.

<VCO Mode>

In VCO mode, the operation of the proposed ADC is the same as the operation of a conventional VCO-based ADC. Thus, all the advantages of a conventional VCO-based ADC are still obtainable. For example, it is possible to exploit the trade-off between speed and resolution.

<GRVCO Mode>

In GRVCO mode, when the oscillation of a GRVCO stops, the proposed GRVCO preserves the analogue state at the output node of each delay element stage. This is unlike a conventional GVCO which does not preserve the analogue state.

The analogue state preservation of the proposed GRVCO may enable first-order noise shaping, leading to the resolution enhancement.

FIG. 1 shows a GRVCO-based ADC architecture in accordance with the invention. The GRVCO-based ADC comprises a GRVCO 10 and a quantizer 12.

The GRVCO 10 is configured to generate a phase signal PS according to an input voltage V_in.

The GRVCO 10 is arranged for integrating an instant frequency which is proportional to the input voltage V_in into a phase signal PS which carries phase information associated with the input voltage V_in.

The GRVCO 10 has two modes of operation depending on a Gating Signal provided to it from a Gating Signal Generator 14. If the Gating Signal indicates that the gating function is disabled, the GRVCO 10 operates as a conventional ring-based VCO. If the Gating Signal indicates that the gating function is enabled, the GRVCO 10 preserves the oscillation state/phase when the oscillation of a GRVCO is suspended.

The Gating Signal Generator 14 is configured to generate the Gating Signal based on an input clock signal CLK and an input MODE signal. Thus, the input MODE signal is used to generate the Gating Signal, and so depending on the MODE signal, the GRVCO will operate in a VCO mode or GRVCO mode. In other words, the MODE signal determines the ADC's operating mode: either a VCO mode or a GRVCO mode. In the VCO mode, gating is always disabled, so the GRVCO is equivalent to a conventional VCO. In the GRVCO mode, gating and un-gating is controlled by a gating signal generator so as to suspend oscillations of the ring oscillator of the GRVCO and preserve a state of the ring oscillator. Therefore, the GRVCO-based ADC can support dual modes according to a mode control signal, and it can be used for applications where power scalable ADCs are necessary as well as applications where conventional VCO-based ADCs are necessary.

The quantizer 12 is coupled to the output of the GRVCO 10 and is configured to generate a quantized phase output signal QS. The quantized phase output signal QS is a bit vector, and its width is determined by ADC resolution requirements.

The GRVCO-based ADC also comprises a frequency extraction stage—16 comprising first 18 and 20 second flip-flop banks. The quantized phase output signal QS is provided from the quantizer 12 to the input of the first flip-flop bank 18 (which is clocked by the clocking signal CLK). The output of the first flip-flop bank 18 is provided to the input of the second flip-flop bank 20 (which is also clocked by the clocking signal CLK). The outputs from each of the first 18 and second 20 flip-flop banks are provided to a subtracting unit 22 which extracts frequency information to provide an output signal "output" of the ADC. Each size of first 18 and second 20 flip-flop banks is the same as the width of the quantized phase output signal QS.

A quantization method can be determined by the structure of a GRVCO's delay cell: (Pseudo) Differential cell Vs. Single-ended cell. The coarse/fine quantization is usually performed with a GRVCO based on (pseudo) differential cells.

Since a VCO based on (pseudo) differential delay cells can use wire inversion, both even and odd number of delay stages are possible. Therefore, a thermometer code for fine quantization can be generated directly by cascaded delay cells, and the coarse quantization is conducted by a counter which counts the number of oscillations. In the case of a GRVCO based on single-ended delay cells, however, counting-based quantization is carried out. Since the signal polarity inversion occurs along the delay cells' outputs, a thermometer code generation is not possible. Instead, a counter attached to every delay stage's output performs coarse quantization, and their summation produces the equivalent result to the coarse/fine quantization.

The GRVCO's active time plays a role in determining the signal-to-quantization noise ratio (SQNR) performance. The GRVCO's activation is synchronized to a clock signal, and after some amount of delay, a GRVCO is deactivated. To implement this function, either a pulse generation circuit or external duty cycle-modulated clock signal can be used, as shown in FIG. 2.

Figure 2:
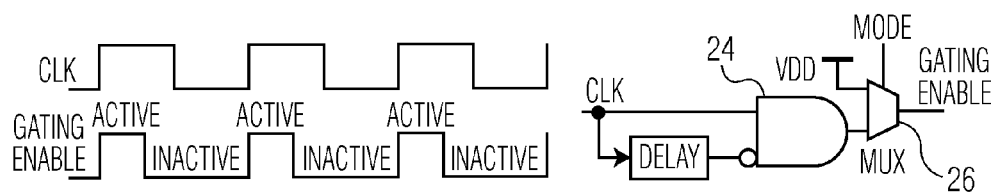
FIG. 2 shows exemplary waveforms for the clock signal CLK and a gating signal "Gating Enable" along with an example of a circuit arrangement that may be employed to generate such waveforms according to an embodiment.

FIG. 2 shows exemplary waveforms for the clock signal CLK and a gating signal ("Gating Enable") along with an example of a circuit arrangement that may be employed to generate such waveforms. The circuit arrangement comprises an AND logic gate 24 having the clock signal CLK provided to its first input and having a delayed and inverted version of the clock signal CLK provided to its second input. The output of the AND logic gate 24 is provided to the first input of a Multiplexer MUX 26, which has a supply voltage VDD provided to its second input and the MODE signal provided to its control input. Depending on the value of the MODE signal supplied to the multiplexer MUX 26, either the value of the supply voltage VDD or the AND logic gate output is provided at the output of the multiplexer MUX 26 as the gating signal ("Gating Enable").

A simulation model has been used to verify the concept of the proposed GRVCO-based ADC. Here, the GRVCO-based ADC is assumed to have about 76 dB SQNR at 100 MS/s.

Figure 3:
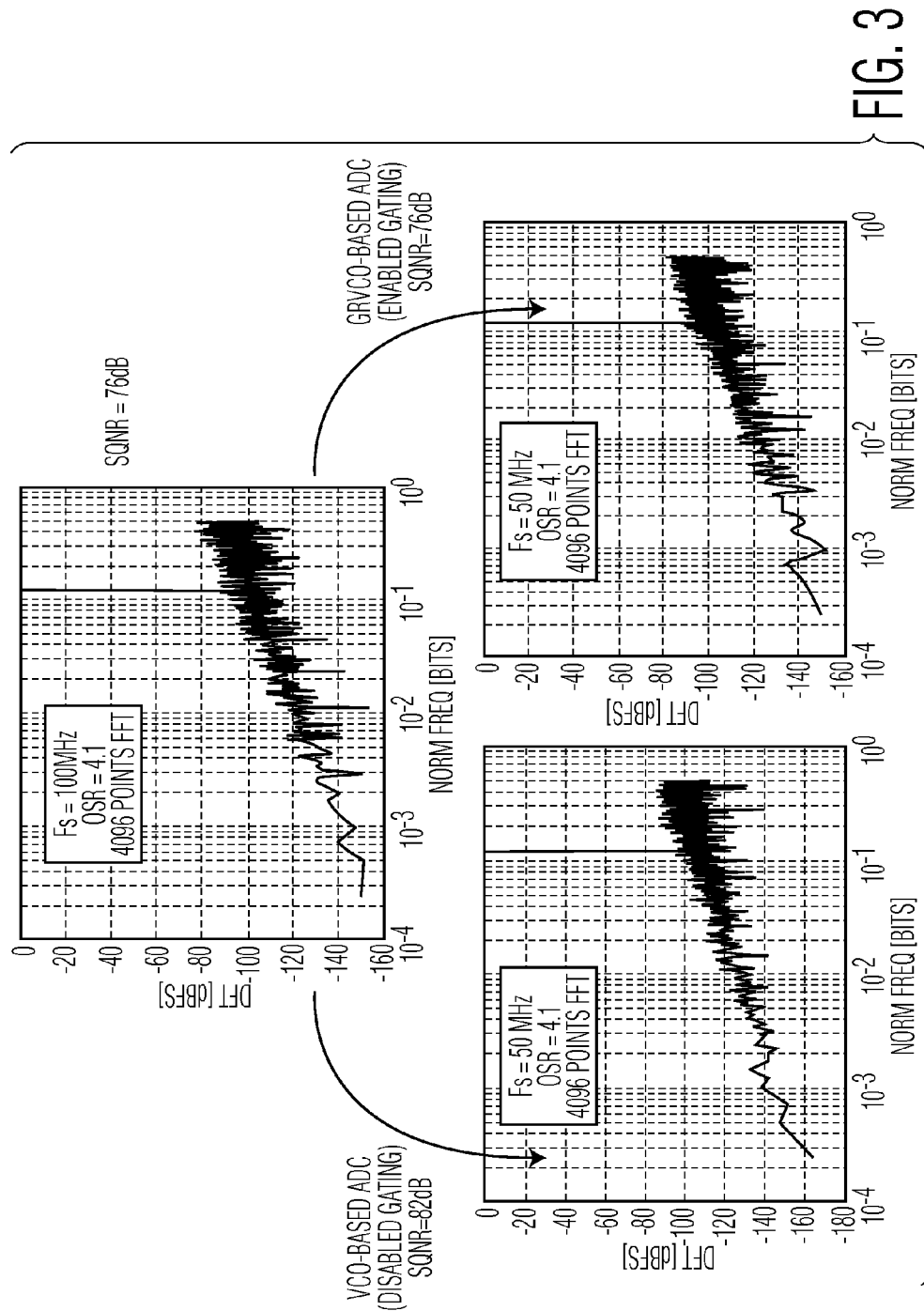
FIG. 3 shows the SQNR performance versus sampling frequency for: (i) a VCO-based ADC; and (ii) a GRVCO-based ADC according to an embodiment.

The following two cases have investigated for the sampling frequency down-scaling to 50 MS/s: (i) VCO-based ADC; and (ii) GRVCO-based ADC, and the results are illustrated in FIG. 3 (which shows the GRVCO-based ADC's SQNR performance vs. sampling frequency for the two cases).

In the former case (i), SQNR increases from 76 dB by 6 dB to 82 dB because the phase accumulation is doubled during the sampling period while the ADC keeps consuming energy.

In the latter case (ii), however, SQNR does not increase from 76 dB because there is no more phase accumulation.

Although the former case (i) may initially appear to be better than the latter case (ii), this is not necessarily true because more SQNR enhancement is not necessary once enough SQNR is obtained. Furthermore, the latter cases' power consumption in the VCO is halved due to the doubled sampling period.

Consequently, power scalability with constant ENOB is achieved by the proposed GRVCO-based ADC, whereas a conventional VCO-based ADC exhibits the trade-off between speed and resolution with more power consuming. Additionally, noise shaping property may still be observed in the proposed ADC architecture.

It has been identified that there is an optimal bit partition for coarse/fine quantization.

In case of coarse/fine quantization, the question of how to assign the total number of bits into a coarse quantizer and a fine quantizer respectively is an important consideration for the optimization of energy dissipation per sample. Intuitively, a short-length ring oscillator produces less fine bits, leading to high activity in a coarse quantizer, whereas a long-length ring oscillator generates more fine bits, leading to low activity in a coarse quantizer. Therefore, when the active time of the GRVCO and the GRVCO's running frequency are given, the bit assignment problem transforms into an energy optimization problem, as shown by the following equations:

Minimize $E_{total} = E_{GRVCO} + E_{FINE} + E_{COARSE}$

Subject to $a + b = N$ $E_{GRVCO} = f(T_{ACTIVE}, T_{GRVCO}, a)$
$E_{COARSE} = f(T_{ACTIVE}, T_{GRVCO}, b)$
$E_{FINE} = f(T_{ACTIVE}, T_{GRVCO}, a)$ where a and b are the number of bits for fine/coarse quantization respectively, N is the total number of bits, $T_{ACTIVE}$ is the active time of the GRVCO, and $T_{GRVCO}$ is the period of the GRVCO. Here, all the energy terms denotes energy consumption per sample.

Figure 4:
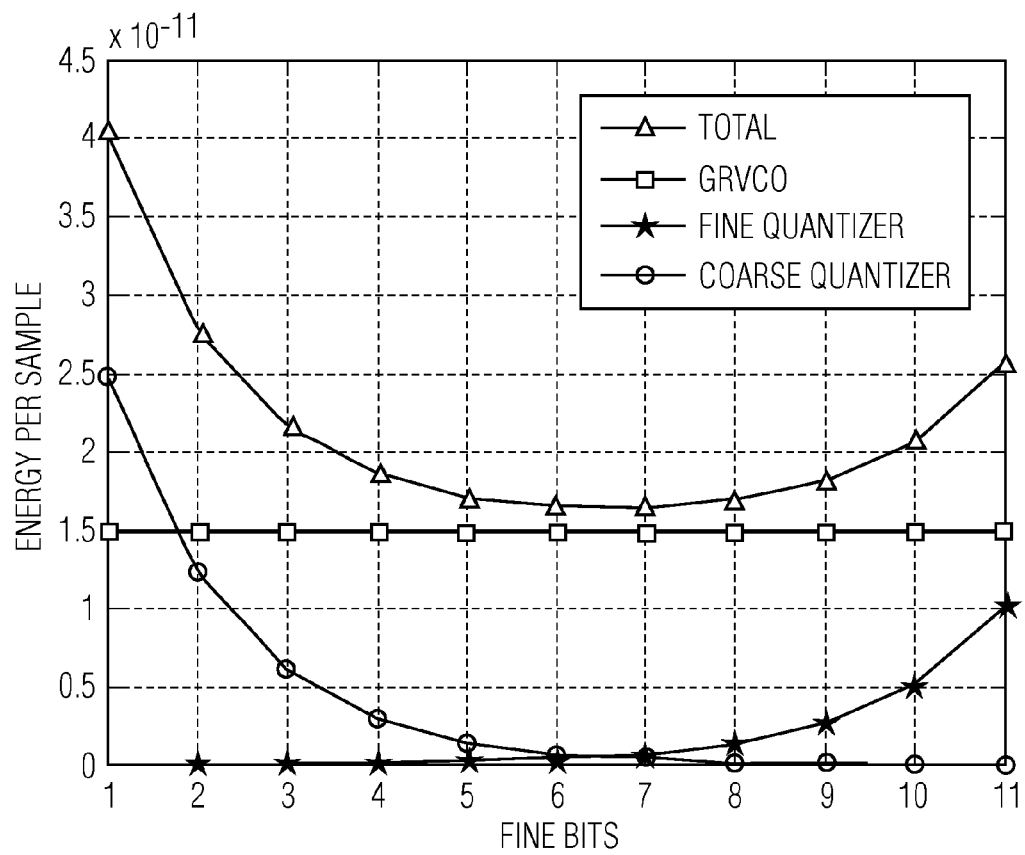
FIG. 4 is a graph of energy per sample versus fine bits illustrating energy optimization for a GRVCO-based ADC according to an embodiment.

FIG. 4 shows an energy optimization example. Although the specific numbers in the plots can change, depending on real implementations, it can be seen that there exists the optimized bit partition. Furthermore, this optimization process can be applied to both VCO mode and GRVCO mode in the same way.

Equations defining the energy terms may be represented as follow:

$$E_{GRVCO} = \frac{T_{ACTIVE}}{T_{GRVCO}} \cdot 2^a \cdot E_{DELAY} = \frac{T_{ACTIVE}}{T_{DELAY}} \cdot E_{DELAY} = const$$

$$E_{COARSE} = E_{TFF} \cdot \left( \begin{array}{c} \text{floor}\left[\frac{T_{ACTIVE}}{T_{GRVCO}}\right] + \\ \text{floor}\left[\frac{T_{ACTIVE}}{2T_{GRVCO}}\right] + \ldots + \text{floor}\left[\frac{T_{ACTIVE}}{2^{b-1}T_{GRVCO}}\right] \end{array} \right)$$

$$E_{FINE} = E_{DFF} \cdot k \text{ where } k = \text{floor}\left[\frac{T_{REMAINDER}}{T_{DELAY}}\right] \text{ when}$$

$$\text{floor}\left[\frac{T_{REMAINDER}}{T_{DELAY}}\right] \leq 2^{a-1} = 2^a - \text{floor}\left[\frac{T_{REMAINDER}}{T_{DELAY}}\right] \text{ o.w.}$$

$$T_{ACTIVE} = T_{GRAVCO} \cdot M + T_{REMAINDER}$$

where $E_{DELAY}$ is unit delay element's switching energy consumption, $T_{DELAY}$ is unit delay element's propagation delay, $E_{TFF}$ is T flip-flop's energy consumption, $E_{DFF}$ is D flip-flops' energy consumption, and M is an integer. Here it is assumed that a coarse quantizer and a fine quantizer mainly comprises T flip-flops and D flip-flops, respectively. An encoder's energy consumption is neglected.

Figure 5B:
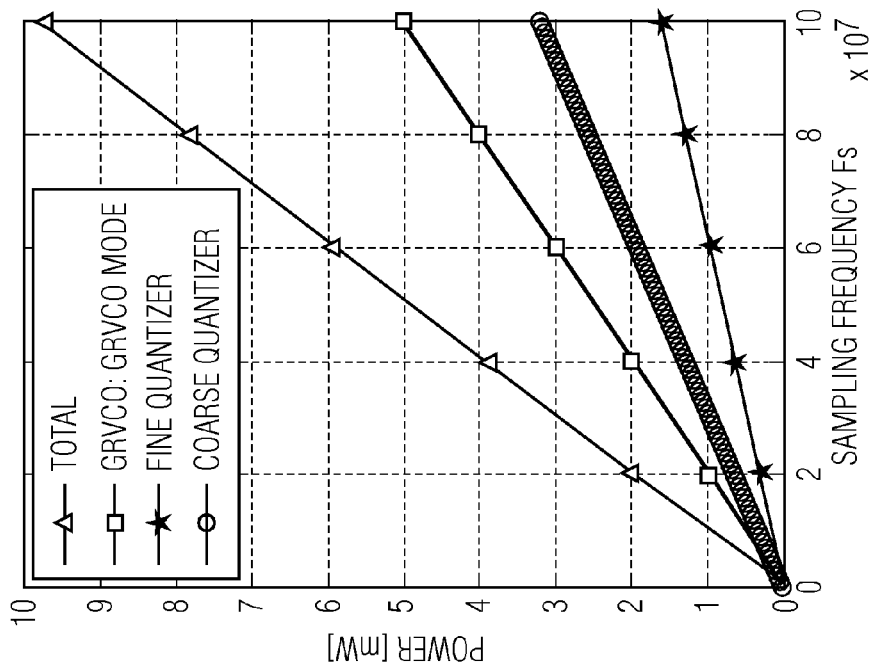
FIG. 5B is a graph of power versus sampling frequency for a GRVCO-based ADC according to an embodiment.
Figure 5A:
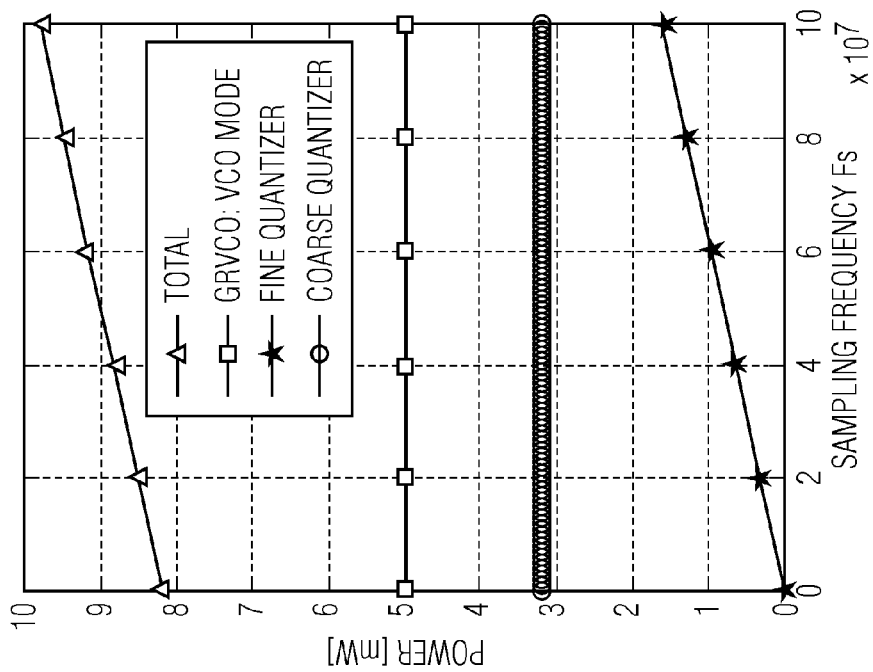
FIG. 5A is a graph of power versus sampling frequency for a conventional VCO-based ADC.

FIG. 5A is a graph of power versus sampling frequency for a conventional VCO-based ADC. FIG. 5B is a graph of power versus sampling frequency for a GRVCO-based ADC according to an embodiment. It will therefore be appreciated that FIG. 5 enables a comparison of power scalability between a conventional VCO-based ADC and a GRVCO-based ADC according to an embodiment. Although the specific numbers in the plots can change, depending on actual implementations, improved power scalability is observed in the GRVCO mode. Thus, the proposed GRVCO-based ADC demonstrates improved power scalability with constant bit resolution performance, and this is illustrated by FIG. 5.

Calibration

Digital calibration can be used instead of an analog feedback loop in order to save area and power consumption. For example, a look-up table can be used for the nonlinearity characterization and distortion correction. To reduce design effort, near-worst corner design can be used. Forward Body Bias (FBB)/Reverse Body Bias (RBB) may be used to tune the circuit after fabrication.

Noise Shaping

The noise shaping property may be important in a VCO-based ADC in order to improve the resolution performance. In order to use this property, an analog state at each delay element's output may be preserved when the oscillation is stopped.

Figure 6:
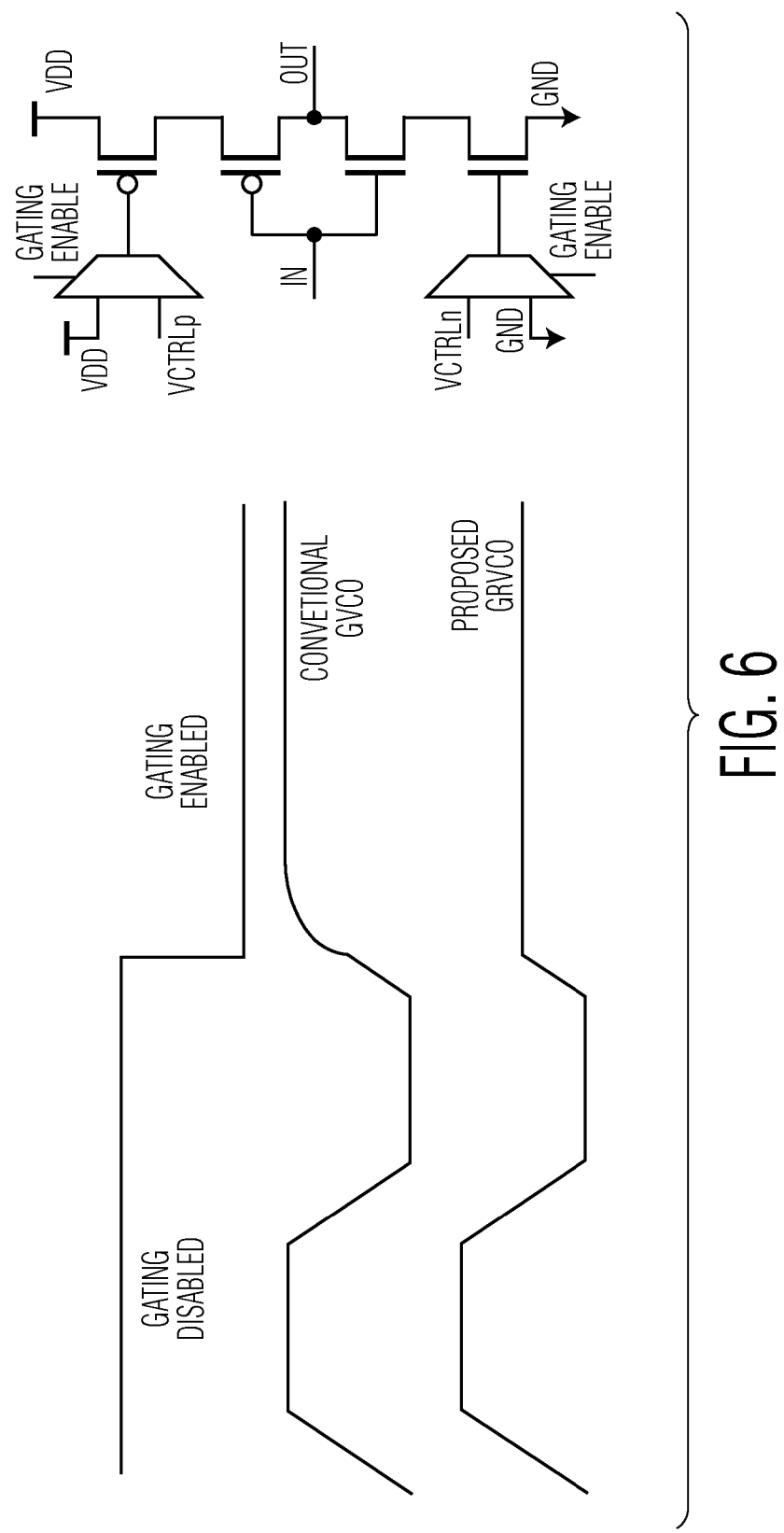
FIG. 6 illustrates the output behaviour of a conventional GVCO and a GRVCO according to an embodiment.

FIG. 6 shows the output behaviour of a conventional GVCO and a GRVCO according to an embodiment. Also shown in FIG. 8 (at the right-hand side) is an example of a delay cell implementation in a GRVCO according to an embodiment. As demonstrated by the lowermost waveform of FIG. 8, the proposed GRVCO preserves the oscillation state/phase when oscillation is suspended (e.g. when gating is enabled).

This analogue state preservation of the proposed GRVCO enables first-order noise shaping, leading to the resolution enhancement.

Architectural Variants

A VCO-based ADC has some architectural variants, such as a differential architecture and a time-interleaved architecture. A differential architecture using two VCOs is known to improve linearity by cancelling even-order distortion. A time-interleaved architecture is useful for energy efficient high speed applications.

A GRVCO according to an embodiment may be used to replace a VCO in these variants.

Figure 7:
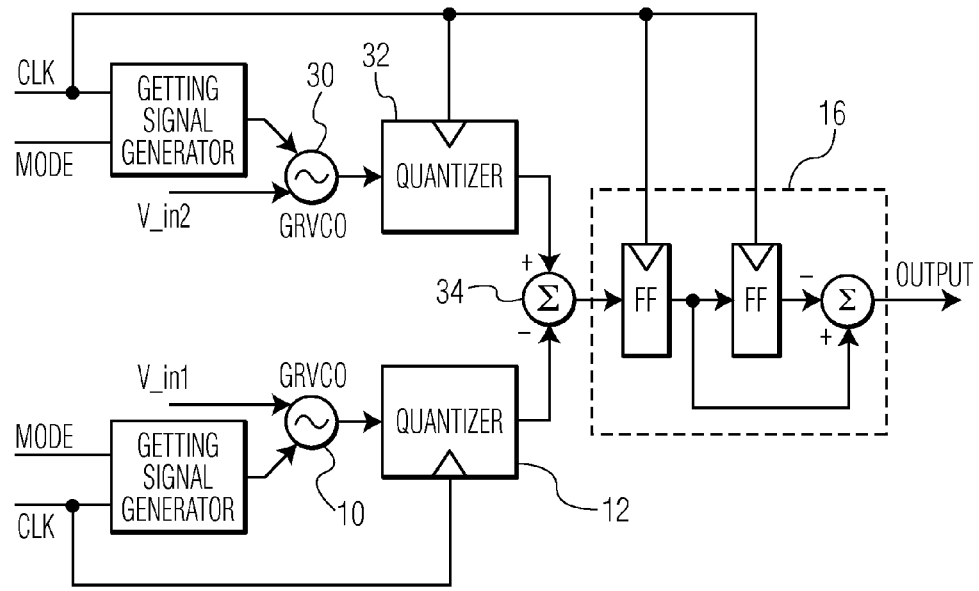
FIG. 7 illustrates a differential VCO architecture employing first and second GRVCOs according to an embodiment.

By way of example, FIG. 7 shows a differential architecture employing first and second GRVCOs according to an embodiment. This differential architecture is similar to that shown in FIG. 1, except that it employs a second GRVCO 30 and a second quantizer 32 arranged in a similar manner to the first GRVCO 10 and first quantizer 12. The output from each quantizer 12,32 is provided to a summation unit 34 which then has its output provided to the frequency extraction stage 16. The first and second GRVCOs each have their own input voltage signal V_in1 and V_in2, respectively, and gating signal generator.

Figure 8:
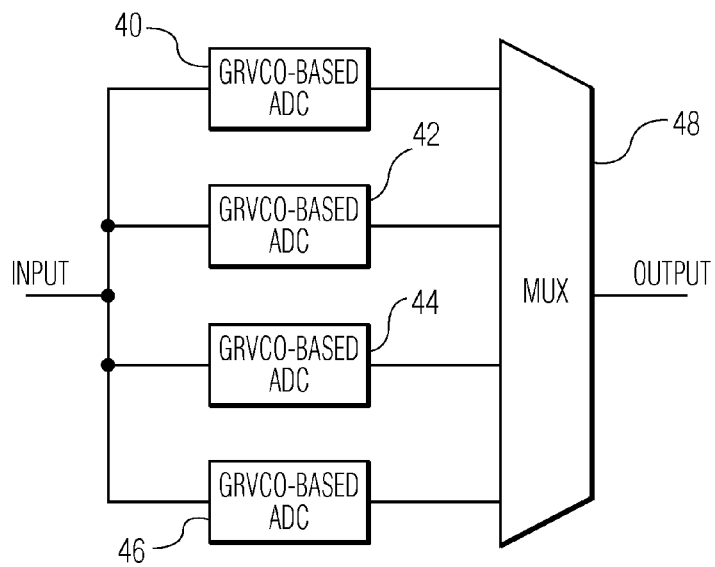
FIG. 8 illustrates a time-interleaved VCO architecture employing first to fourth GRVCO-based ADCs according to an embodiment.

Also, FIG. 8 shows a time-interleaved architecture employing first 40 to fourth 46 GRVCO-based ADCs according to an embodiment, wherein the output of each GRVCO-based ADC is provided to a multiplexer MUX 48.

Figure 9:
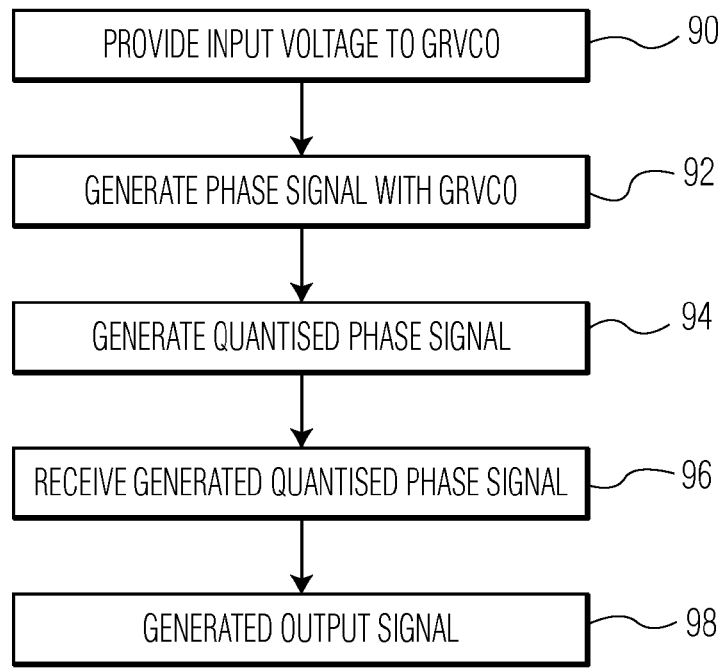
FIG. 9 is a flow diagram of an ADC conversion method according to an embodiment.

Turning now to FIG. 9, there is depicted a flow diagram of an ADC conversion method to an embodiment of the invention. The method begins in step 90 in which an input voltage is provided to a GRVCO. Next, in step 92, a phase signal is generated using a GRVCO according to the input voltage. The step 402 of generating a phase signal includes operating the GRVCO in either a first or second mode of operation according to a mode control signal, wherein, in the first mode of operation, the GRVCO operates in a VCO mode with gating disabled and, in the second mode of operation, the GRVCO operates in a GRVCO mode wherein gating is enabled or disabled according to a gating signal. Here, the gating control signal may be generated according to a clock signal and the mode control signal.

The method then proceeds to step 94, wherein a quantised phase output signal is generated based on the generated phase signal.

Next, in step 96, the generated quantised phase output signal is received for processing. The method then proceeds to step 98 wherein one or more delayed versions of the received quantised phase output signal are created an output signal is generated based on the one or more delayed versions of the received quantised phase output signal.

Figure 10:
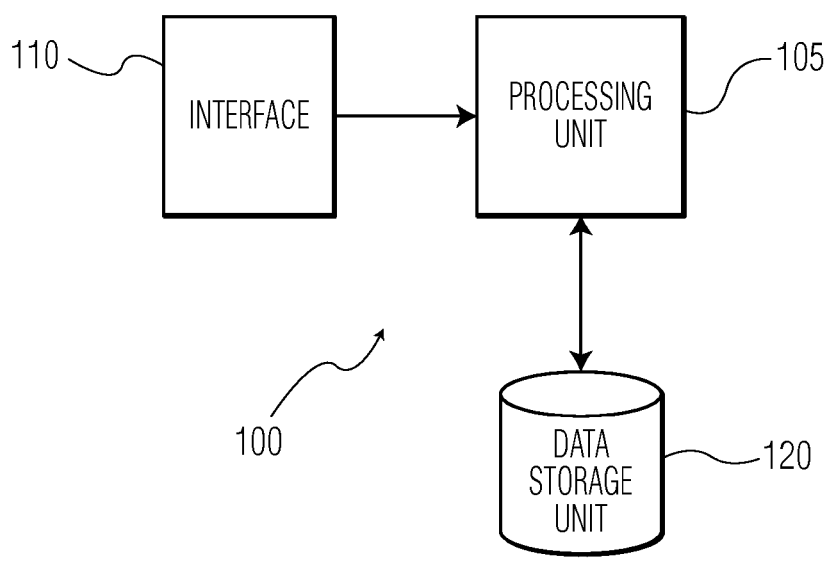
FIG. 10 is a schematic block diagram of a computer system according to an embodiment.

Referring now to FIG. 10, there is illustrated a schematic block diagram of a computer system 100 according to an embodiment. The computer system 100 is configured to implement an ADC conversion method to an embodiment of the invention. The system comprises a processing unit 105 having an interface 110, and a non-transitory data storage unit 120 connected to the processing unit 105.

The interface 110 is configured to receive an input voltage (or a control signal for defining an input voltage).

The data storage unit 120 is configured to store computer-readable program code for execution by the processing unit 105. The processing unit 105 is configured to execute a computer program (defined at least in part by computer-readable program code stored by the data storage unit 120) which, when executed, causes the system to implement the steps of a method according to an embodiment, for example the steps as shown in FIG. 9.

The processing unit 105 is configured to receive, via the interface 110, an input voltage.

The processing unit 105 operates a GRVCO to generate a phase signal according the input voltage, and then generates a quantised phase output signal based on the generated phase signal.

The processing unit 105 also generates one or more delayed versions of the quantised phase output signal. Based on the one or more delayed versions of the quantised phase output signal, the processing unit 105 generates an output signal. The generated output signal is supplied from the processing unit 105 to a user or external application via the interface 110. The processing unit 105 may also supply the generated output signal to the data storage unit 120 (so that the output signal can be stored by the data storage unit 120).

Embodiments may thus provide an apparatus and method for ADC conversion using a GRVCO. It will be clear to one of ordinary skill in the art that all or part of the method of one embodiment of the present invention may suitably and usefully be embodied in a logic apparatus, or a plurality of logic apparatus, comprising logic elements arranged to perform the steps of the method and that such logic elements may comprise hardware components, firmware components or a combination thereof.

It will be equally clear to one of skill in the art that all or part of a logic arrangement according to one embodiment of the present invention may suitably be embodied in a logic apparatus comprising logic elements to perform the steps of the method, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

It will be appreciated that the method and arrangement described above may also suitably be carried out fully or partially in software running on one or more processors (not shown in the figures), and that the software may be provided in the form of one or more computer program elements carried on any suitable data-carrier (also not shown in the figures) such as a magnetic or optical disk or the like. Channels for the transmission of data may likewise comprise storage media of all descriptions as well as signal-carrying media, such as wired or wireless signal-carrying media.

In one alternative, one embodiment may be realized in the form of a computer implemented method of deploying a service comprising steps of deploying computer program code operable to cause the computer system to perform all the steps of the method when deployed into a computer infrastructure and executed thereon.

In a further alternative, one embodiment may be realized in the form of a data carrier having functional data thereon, the functional data comprising functional computer data structures to, when loaded into a computer system and operated upon thereby, enable the computer system to perform all the steps of the method.

The flowchart and block diagram in the above figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments may be used in low power applications demanding multiple operating speeds and multiple standard compliancy.

Moreover, in many applications, a conventional VCO-based ADC can be replaced with a GRVCO-based ADC according to an embodiment. Thus, a GRVCO can be used for both conventional VCO-based ADC applications and power scalable ADC applications which require wide input bandwidth or low oversampling ratio.

Such applications where a GRVCO-based ADC according to an embodiment may be employed include a multi-format video processor, software-defined radio, multi-sensor system, etc.

Embodiments may provide GRVCO for voltage-to-phase conversion, a counter and an encoder for phase-to-digital conversion.

A method is generally conceived to be a self-consistent sequence of steps leading to a desired result. These steps require physical manipulations of physical quantities. Usually, though not necessarily, these quantities take the form of electrical or magnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities.

The present invention may further suitably be embodied as a computer program product for use with a computer system. Such an implementation may comprise a series of computer-readable instructions either fixed on a tangible medium, such as a computer readable medium, for example, e.g. a CD-ROM, DVD, USB stick, memory card, network-area storage device, internet-accessible data repository, and so on, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

While one or more embodiments have been illustrated in detail, one of ordinary skill in the art will appreciate that modifications and adaptations to those embodiments may be made.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An analogue to digital converter, ADC, comprising:
    a Gated Ring Voltage Controlled Oscillator, GRVCO, configured to generate a phase signal according to an input voltage; and
    a quantization circuit configured to generate a quantised phase output signal,
    wherein the GRVCO is configured to operate in either a first or a second mode of operation according to a mode control signal, wherein, in the first mode of operation, the GRVCO operates in a VCO mode with gating disabled and, in the second mode of operation, the GRVCO operates in a GRVCO mode wherein gating is enabled or disabled according to a gating signal.

2. The ADC of claim 1, wherein, when gating is disabled, oscillations of the ring oscillator are permitted and, when gating is enabled, oscillations of the ring oscillator are suspended and a state of the ring oscillator is preserved.

3. The ADC of claim 1, wherein the GRVCO comprises a gating signal generator configured to generate the gating control signal according to a clock signal and the mode control signal.

4. The ADC of claim 3, wherein the gating signal generator comprises a logic arrangement and a multiplexer,
    wherein the logic arrangement is configured to generate a first input signal of the multiplexer from a reference clock signal,
    wherein a supply voltage is supplied to the second input of the multiplexer,
    and wherein the mode control signal is supplied to the control terminal of the multiplexer such that the, depending on the value of the mode control signal, the multiplexer is configured to output one of the value of the first and second multiplexer input as the gating control signal.

5. The ADC of claim 1, wherein the ring oscillator of the GRVCO comprises a plurality of inverting elements, and wherein each said inverting element is connected to a positive power supply via a first respective transistor and connected to a negative power supply via a second respective transistor.

6. The ADC of claim 5, wherein, in the first mode of operation, the first and second switches connected to each inverting element are configured to be closed so as to enable oscillations in the ring oscillator, and wherein, in the second mode of operation, the first and second switches connected to each inverting element are configured to be open so as to suspend oscillations in the ring oscillator.

7. The ADC of claim 1, further comprising an output circuit configured to receive the generated quantised phase output signal from the quantization circuit and to generate an output signal based on at least one or more delayed version of the received quantised phase output signal.

8. The ADC of claim 7, wherein the output circuit comprises first and second flip-flop banks and a summation unit,
    wherein the generated quantization output signal is provided to an input of the first flip-flop bank, and the output of the first flip-flop bank is provided to an input of the second flip-flop bank,
    and wherein the outputs from each of the first and second flip-flops are provided to inputs of the summation unit which is configured to generate the output signal based on a subtraction of its inputs.

9. A differential ADC comprising first and second ADCs according to claim 1.

10. A time-interleaved ADC comprising:
    a plurality of ADCs according to claim 1; and
    a multiplexer configured to select an output of the plurality of ADCs according to a selection signal.

11. An analogue to digital conversion conversion method comprising:
    generating a phase signal with a Gated Ring Voltage Controlled Oscillator (GRVCO) according to an input voltage; and
    generating a quantised phase output signal according to the generated phase signal,
    wherein the step of generating a phase signal comprises operating the GRVCO in either a first or a second mode of operation according to a mode control signal, wherein, in the first mode of operation, the GRVCO operates in a VCO mode with gating disabled and, in the second mode of operation, the GRVCO operates in a GRVCO mode wherein gating is enabled or disabled according to a gating signal.

12. The method of claim 11 further comprising the steps of: receiving the generated quantised phase output signal; and generating an output signal based on at least one delayed version of the received quantised phase output signal.

13. The method of claim 11, further comprising the step of generating the gating control signal according to a clock signal and the mode control signal.

14. A computer program product comprising a non-transitory computer-readable storage medium having a computer-readable program code, which, when executed on a computer comprising at least one processor, causes the at least one processor to implement the steps of the method of claim 11.

15. A computer system comprising at least one processor and the computer program product of claim 14, wherein the at least one processor is configured to execute said computer readable program code.

* * * * *